(12) United States Patent
Bamji et al.

(10) Patent No.: US 8,314,924 B2
(45) Date of Patent: Nov. 20, 2012

(54) CMOS THREE-DIMENSIONAL IMAGE SENSOR DETECTORS WITH ASSURED NON COLLECTION OF LATE ARRIVING CHARGE, MORE RAPID COLLECTION OF OTHER CHARGE, AND WITH IMPROVED MODULATION CONTRAST

(75) Inventors: Cyrus Bamji, Fremont, CA (US); Swati Mehta, Fremont, CA (US); Tamer Ahmed Taha Elkhatib, Troy, NY (US)

(73) Assignee: Microsoft Corporation, Redmond, WA (US)

( * ) Notice: Subject to any disclaimer, the term of this patent is extended or adjusted under 35 U.S.C. 154(b) by 218 days.

(21) Appl. No.: 12/658,833

(22) Filed: Feb. 16, 2010

(65) Prior Publication Data

US 2011/0291164 A1 Dec. 1, 2011

Related U.S. Application Data

(60) Provisional application No. 61/207,970, filed on Feb. 17, 2009.

(51) Int. Cl.
*G01C 3/08* (2006.01)

(52) U.S. Cl. ............ 356/5.01; 356/3.01; 356/4.01; 356/5.1

(58) Field of Classification Search ........ 356/3.01–28.5, 356/139.01–139.1
See application file for complete search history.

(56) References Cited

U.S. PATENT DOCUMENTS

| | | | | |
|---|---|---|---|---|
| 6,091,093 A | * | 7/2000 | Kang et al. | 257/292 |
| 2003/0127647 A1 | * | 7/2003 | Street et al. | 257/59 |
| 2008/0042233 A1 | * | 2/2008 | Kim | 257/519 |

* cited by examiner

*Primary Examiner* — Luke Ratcliffe
(74) *Attorney, Agent, or Firm* — Vierra Magen Marcus & DeNiro LLP

(57) ABSTRACT

A CMOS-implementable TOF detector promptly collects charge whose creation time can be precisely known, while rejecting collection of potentially late arriving charge whose creation time may not be precisely known. Charges created in upper regions of the detector structure are ensured to be rapidly collected, while charges created in the lower regions of the detector structure, potentially late arriving charges, are inhibiting from being collected.

20 Claims, 7 Drawing Sheets

CMOS THREE-DIMENSIONAL IMAGE SENSOR DETECTORS WITH ASSURED NON COLLECTION OF LATE ARRIVING CHARGE, MORE RAPID COLLECTION OF OTHER CHARGE, AND WITH IMPROVED MODULATION CONTRAST

CROSS-REFERENCE TO CO-PENDING APPLICATION

Priority is claimed from applicants' U.S. provisional patent application Ser. No. 61/207,970, filed 17 Feb. 2009, and assigned to Canesta, Inc., of Sunnyvale, Calif., assignee herein.

BACKGROUND OF THE INVENTION

The invention relates generally to CMOS-implementable image sensors suitable for three-dimensional applications including time-of-flight (TOF) and phase-based TOF range or depth systems. More specifically, the invention concerns improving quality of acquired depth data by assuring non-collection of late arriving charges, and to shortening the collection time for remaining charges.

Ordinary color cameras have a sensor that comprises an array of color pixels that acquire a two-dimensional image of a scene, for which each pixel produces a color value. A black and white camera has an array whose pixels produce gray scale values. Incoming light (photon energy) from the scene falls upon the color or gray scale pixel array and produces charges that are collected in a fashion most beneficial to the color or black and white two-dimensional images that are acquired. Two-dimensional camera systems attempt to maximize collection of charges without serious concern to how long it takes to collect the charge. Typically such cameras acquire visible wavelengths of light in the 400 nm to 650 nm range, which means that most charges are created near the surface. Conventional two-dimensional camera systems acquire data with integration times on the order of milliseconds, and it suffices for such cameras to have ms collection times. Thus conventional two-dimensional cameras have the luxury of being able to wait and collect substantially all generated charge, even the slowest arriving charge. If there were error in a conventional camera system due to slowly arriving charge, the error might manifest as a slight blurring on the image acquired. Two-dimensional camera systems also seek to minimize crosstalk, which is the collection of charges from photons impinging on one pixel by adjacent pixels. Improvements to charge collection in two-dimensional cameras, including infrared cameras, are described in U.S. Pat. No. 6,683,360 (2004) to Dierickx. Dierickx '360 describes methods to increase quantum efficiency of MOS/CMOS pixel sensors and enhance charge collection using doping concentration gradients. However Dierickx '360 is silent as to how to simultaneously maximize collection of useful charges while minimizing collection of non-useful charges in a TOF system, a manner of charge collection to which the present invention is directed.

By contrast, a three-dimensional TOF system, phase based or otherwise, typically operates using longer wavelength optical energy, e.g., perhaps 850 nm, and requires an array of depth sensing pixels Z-depth value corresponding to a point in the scene or target object being imaged. These wavelengths mean some charge may be generated deep within the detector substrate and can take too long to be collected. Such TOF systems typically have ns modulation periods, which means collection of useful charge must occur within ns, to avoid degrading the acquired depth data and to avoid increased shot noise by also collecting late arriving charge. Thus a challenge associated with charge collection in three-dimensional TOF systems is to somehow rapidly collect useful charge and not collect charge that would arrive too late at the detector collection regions. This challenge is satisfied by embodiments of the present invention.

It is useful at this juncture to briefly describe TOF systems. FIGS. 1A-1C depict a phase-based TOF system 100 such as described in U.S. Pat. No. 7,352,454 (2008) entitled Methods and Systems for Improved Charge Management for Three-Dimensional and Color Sensing. The '454 patent is assigned to Canesta, Inc. of Sunnyvale, Calif. and is incorporated herein by reference. TOF system 100 such as described in the '454 patent is phase-based and acquires depth distance Z by examining relative phase ($\phi$) shift between TOF system transmitted optical energy signals $S_1$, and a fraction of such signals $S_2$ reflected from a target object 20 distance z away.

System 100 includes a CMOS fabricatable IC 110 whereon is formed a two-dimensional array 130 of pixel detectors 140, each of which has circuitry 150 for processing detection charge output by the associated detector. IC 110 also includes a microprocessor or microcontroller unit 160, memory 170 (which preferably includes random access memory or RAM and read-only memory or ROM), a high speed distributable clock 180, and various computing and input/output (I/O) circuitry 190. Among other functions, microprocessor or controller unit 160 may perform distance to object and object velocity calculations. IC 100 further includes an oscillator 115 that is controllable by microprocessor 160 and coupled to optical energy emitter 120. Emitter 120 may be a laser diode or LED, with output wavelength of perhaps 800 nm to 850 nm. Emitter 120 may be allow peak power unit whose output is a periodic signal with perhaps 200 mW peak power, and a repetition rate of perhaps 100 MHz. For ease of illustration assume that the emitter output, which may be transmitted through optical system 125 may be represented as A·cos($\omega$t), where waveform period. T is given by T=2$\pi$/$\omega$. It is understood that $S_1$ may be other than sinusoidal, e.g., perhaps square wave, triangular wave, among other waveforms.

As shown by FIGS. 1B and 1C, there will be a phase shift $\phi$ due to the time-of-flight (TOF) required for energy transmitted by emitter 120 ($S_1$=cos($\omega$t) to traverse distance z to target object 20, and be reflected as return energy $S_2$=A·cos ($\omega$t+$\phi$), where coefficient A may represent brightness of $S_2$. The $S_2$ return energy is detected by a photodetector 140 in array 130, where the array may include perhaps 100×100 or more photodetectors. The phase shift $\phi$ due to time-of-flight is:

$$\phi = 2\cdot\omega\cdot z/C = 2\cdot(2\pi f)\cdot z/C$$

where C is the speed of light 300,000 Km/sec. Thus, distance z from energy emitter (and from detector array) to the target object is given by:

$$z = \phi\cdot C/2\omega = \phi\cdot C/\{2\cdot(2\pi f)\}$$

In system 100, phase $\phi$ and distance z preferably are determined by mixing (or homodyning) the signal $S_2$=A·cos($\omega$t+$\phi$) detected by each pixel detector 140 with the signal driving the optical energy emitter $S_1$=cos($\omega$t). Mixing resulted from differentially modulating the quantum efficiency of the photodetectors in the array. Different banks of photodetectors 140 in sensor array 130 may be quantum efficiency modulated at different phase shifts, e.g., 0°, 90°, 180°, 270°. The signal mixing product $S_1\cdot S_2$ will be 0.5·A·{cos(2$\omega$t+$\phi$)+cos ($\phi$)} and will have a time average value of 0.5·A·cos($\phi$). The system output, denoted DATA, can include depth images as well as other acquired information. System 100 requires no moving parts, can be implemented in CMOS, is operable with or without ambient light, and can have many applications including implementing virtual input devices, range finding, gesture recognition systems, object recognition, etc.

Understandably, acquiring accurate depth images will depend upon the nature and quality of the pixel sensors, and their ability to accurately and correctly collect charge generated by incoming optical energy. As described herein, the present invention enables detectors 140 in array 130 to maximize collection of charge useful to creating an accurate depth image, and to minimize collection of charge that would detract from creating an accurate depth image of the rate of collection in the elongated direction.

It is useful to review challenges associated with efficient collection of photon-energy induced charge in a semiconductor substrate to gain a fuller appreciation of the present invention. The '454 patent provides a useful starting point, and will be described briefly with respect to FIGS. 2A-2E. As more fully described in the '454 patent, preferably detectors 140 collected charge in two stages. The detector structure included multiple finger-shaped poly material gates, denoted A-gates and B-gates, disposed parallel to each other along a y-axis, and spaced-apart a distance much shorter than their length along an x-axis. Elongated charge barrier regions were formed intermediate adjacent A-gates and B-gates to minimize the collection effects of A-gates upon B-gates and vice versa, and thus avoid inter-gate transfer of charge being collected. Detection-generated charge first moved laterally in the X-direction toward a gate biased at a high clock potential at the time. The charge (electrons) only needed to travel locally and the δx distance between adjacent elongated gates was small and the electric field intense. Thereafter the charge moved laterally at a slower rate along the length of the finger-shaped gates for final collection and readout.

FIG. 2B depicts a detector 140, based upon embodiments of the 454 patent. Elongated gates G-A and G-B are coupled to receive G-A and G-B bias clock signals that can be synchronously generated, with respect to phase and frequency, from a master clock generator, e.g., 180, which master clock generator also controls TOF system 100 optical energy emitter 120 (see FIG. 1A). As such, frequency of the G-A and G-B bias clock signals need not be identical to frequency of the master clock generator, but they will be synchronously related. Similarly, phase of the G-A and G-B bias clock signals will be synchronously related to the master clock generator signal. One could, of course, use separate generators for each (or some) of these signals if the proper signal relationships were maintained. FIG. 2B is a cross-section of a sensor detector structure 140-1, with a plot of surface potential at the silicon-gate oxide interface versus position along the X-direction. As noted, charge transfer collection gates A (G-A) and charge transfer collection gates B (G-B) preferably are interleaved elongated or finger-shaped gate structures 620. The nomenclature gate A and gate G-A, gate B, and gate B-G may be used interchangeably, and descriptions of gate G-A are applicable to gate G-B, and vice versa. Two magnitudes of gate A potential are shown, 2.0 V and 3.3 V, with a constant 0 V gate B potential. For 2.0 V gate A potential, surface potential is drawn with solid lines, and is a somewhat idealized profile with relatively little potential migration left and right along the X-axis relative to location of the A gates G-A. Phantom lines are used to depict the 3.3 V gate G-A potential profile. With respect to the detectors shown in FIGS. 2A-2E, when gate potential VA is high, gate potential VB is low and vice versa. Depending upon the high or low state of gate potentials VA or VB, ideally substantially all charge would be collected by gates G-A (when VA=high, VB=low) or gates G-B (when VB=high, VA=low).

In FIG. 2A, consider the case of 2.0 V potential for gate G-A. Under this bias condition, charge-generated electrons under the gate G-B region are trapped. (The trapped electrons are depicted as encircled minus signs.) Trapping occurs because escape from this region requires the electrons to first overcome the potential barrier represented by solid line profile representing the 2 V bias. For the trapped electrons to migrate left or right in FIG. 2A requires overcoming regions of increasing negative potential, e.g., the solid line profile becomes more negative in the left or right direction. But this negative potential tends to repel the electrons, which remain trapped beneath the gate G-B region, as shown. A potential barrier as low as perhaps 100 mV will be sufficient to prevent electron migration as the thermal energy associated with the trapped electrons is insufficient to overcome this barrier. As a result, the electrons will remain trapped beneath the G-B regions, as shown in FIG. 2A.

The term modulation contrast (MC) denotes a measure of collection efficiency, and does not refer to dark or light contrast of an image that may be acquired by Canesta, Inc. sensors or systems. Details and formulae characterizing modulation contrast may be found in the referenced '454 patent. High modulation contrast is desired for high performance sensor applications. But in a high modulation contrast application, it is desired to elevate gate potential G-A to a higher level, e.g., to 3.3 V rather than 2.0 V. But elevating gate potential G-A to 3.3 V causes the potential profile to take on the appearance represented in FIG. 2A by the phantom lines. Unfortunately the resultant potential barrier is insufficient to keep charge-generated electrons associated with (or trapped beneath) gate G-B from being attracted to gate G-A. Looking at the phantom line potential profile in FIG. 2A, migration of the trapped electrons laterally no longer requires overcoming an increasingly negative potential profile; the profile is in fact increasingly positive, a condition favorable to movement of electrons. As a result, charge-generated electrons associated with gate G-B cannot be held (or trapped) in that region and will migrate to gate region G-A. An undesired result is that effective charge collection is impaired, and detector performance is degraded, which is to say modulation contrast decreases.

Note in the above example that the barrier that existed when gate potentials G-A=2.0 V and G-B=0 V disappeared when gate potential G-A was raised to 3.3 V. Conversely the voltage barrier that may exist at gate potentials G-A=3.3 V and G-B=1.0V will disappear when gate potential G-B is lowered to 0 V. One aspect of the present invention is directed to maintaining a potential barrier when the high magnitude of the gate potential is increased or the low magnitude of the gate potential is decreased. Operation of the detector system at these upper and lower extremes of gate potential is desirable in that detector performance is enhanced.

In the embodiment of the cross-sectional view shown in FIG. 2B, a sensor detector structure 140-1 is provided with implanted regions 600 that act as potential barriers. If one could see these implanted regions from the top of the detector substrate, they would appear to be longitudinal or finger-shaped, parallel and interleaved between adjacent finger-shaped polysilicon gates GA, GB. These potential barriers reduce migration of charge-generated electrons between adjacent finger-shaped gates, e.g., from G-A to G-B and vice versa. In the embodiment shown, structure 140-1 includes finger-shaped p+ doped regions 600 that act as an voltage barrier to undesired charge migration, even in the presence of large (e.g., 3.3 V) G-A gate potential. Further, barriers 600 advantageously reduce dark current that would be associated with other types of isolation barriers, e.g., shallow trench isolation, although in some applications shallow trench isolation may in fact be used.

Note in FIG. 2B that even at relatively high 3.3 V G-A gate potential and relatively low G-B gate potential, the presence of p+ regions 600 deepens the potential barrier between the interleaved finger-shaped G-A and G-B gate regions. The presence of the potential barrier advantageously enables detection-generated electron charge collected by gate G-B to remain trapped generally beneath the G-B region for a sufficiently long time to be collected, e.g., for a period of perhaps 100 μS to perhaps as long as a few mS. The charges trapped generally beneath the G-B region repel each other. This mutual repulsion results in the charges being collected at respective charge collection regions (see collector region 630, FIG. 2C) in the detector structure without any gate-induced horizontal electric field.

Advantageously, p+ doped implant regions 600 may be fabricated without need for critically controlled parameters such as magnitude of implant dosage and/or implant depth into substrate 110 of structure 140-1. Masking and doping steps used to create regions 600 may be shared with existing doping steps used elsewhere to fabricate overall structure 140-1.

As will now be described with reference to FIG. 2C, detection problems arise if charge ultimately collected at collection region 630 is drawn out by too high a gate potential at finger-shaped gate regions 620. FIG. 2C depicts structure 140-1 cut along a preferably polysilicon finger-shaped G-A gate 620. It is understood that if gate G-A potential (drawn in phantom line) is too high, a substantial number of electrons (shown as encircled minus signs) can be drawn out of n+ collection region 630 and into the region beneath gate G-A. In FIG. 2C, the G-A potential becomes more positive in the direction of G-A relative to region 630, which potential attracts the negatively charged electrons, as suggested by the left-pointing arrow. Electrons so drawn from the desired collection region into the G-A region may overwhelm the otherwise correct detection function of structure 140-1, as many of these electrons may be lost to G-B gate collection regions. What is needed here is a mechanism to prevent high G-A gate potential from drawing out charge collected in n+ collection region 630. Such a mechanism is provided in the embodiment of FIG. 2D, namely bias gate 640.

Turning now to FIG. 2D, a bias gate 640 has been added to structure 140-1 in FIG. 2C, to form an improved detector structure 140-1. Improved structure 140-1 reduces or prevents charge loss from the n+ collection regions to the gate regions, even in the presence of relatively high gate potential. In the embodiment of FIG. 2D, a bias potential VN+ of about 2.5 V is coupled to n+ collection region 630, and a bias potential VBG of perhaps 1.5 V is coupled to bias gate 640. The magnitude of bias potential VBG is sufficiently low relative to magnitude of bias potential VN+ such that charges collected in bias gate 640 region will be attracted to the N+ 630 region. At the same time, bias potential VBG is sufficiently high in magnitude such that region G-A collected charges will flow in the bias gate 640 region when the modulation clock signal at gate G-A 620 is low. Preferably spacing of bias gate 640 and polysilicon gate 620 is substantially as small as can be produced by the CMOS fabrication process used to create structure 140-1.

Also shown in FIG. 2D are potentials at the surface of silicon structure 1401. The VN+=2.5 V, V G-A=0 V voltage profile is a potential regime that encourages electrons collected or trapped beneath the G-A region to move to collection source region 630 without encountering a potential barrier. The VN+=2.5 V, V G-A=3.3 V voltage profile is a potential regime in which bias gate 640 provides a potential barrier that advantageously prevents electrons collected in N+ region 630 from being pulled into the region beneath gate G-A. Thus it is seen that providing appropriate VN and V G-A bias potentials to structure 140-1, charge loss can be minimized if not substantially eliminated.

In an alternate embodiment to structure 140-1 shown in FIG. 2D, bias gate 640 may be replaced with a light p doping. The light p doping region will create a potential barrier similar to that created and described above by bias gate 640. In short, such doping has the same effect of creating a potential barrier between gates G-A (respectively G-B) and collection source 630.

Turning now to the plan view of FIG. 2E, the detector structure shown includes bias gates 640, which improves charge collection characteristics. For ease of illustration, FIG. 2E does not depict the p doped barriers, and also depicting physical connections to the individual bias gates 640. Such connections are indicated symbolically as a heavy "wire", with encircled "x's" indicating electrical connection to the polysilicon associated with elongated or long finger-shaped gates G-A or G-B. Adjacent the distal ends of finger-shaped polysilicon gate structures G-A, G-B beneath the "x" denoted contacts are bias gate 640 and collection source 630.

Note that electrons collected by a source region 630 need not be captured by gate G-A (or G-B) during a common modulation cycle of G-A (or G-B) clock signal voltage. Such electrons might have been captured by a gate a period of time ago perhaps on the order of many microseconds (μS) or perhaps milliseconds (mS). Such electrons can linger in the substrate region beneath a gate for such lengths of time until ultimately being captured by an adjacent collection source region 630. According to some embodiments of the present invention, such electrons are induced to cross over to bias gate 640 as a result of two actions: the presence of relatively larger numbers of electrons accumulated under gate regions, and the repulsion effect between these electrons. The '454 patent describes various techniques to optimize the detector geometry including use of "T"-shaped gates G-A, G-B to enhance charge collection to increase length of the interface area between G-A (or G-B) gate regions, and bias gate 640. Techniques to reduce source capacitance and various masking techniques were also described.

The '454 patent also described factors affecting modulation contrast (MC), a measure of detector performance that has a maximum value of four or 400%, although 200% is a more realistic value for actual TOF systems 100.

In forming detector structures as described earlier herein, it is preferred that if a lightly doped p substrate 110 is used (dopant concentration of about $5 \cdot 10^{14}/cm^3$) then a spaced-apart distance between adjacent finger-shaped gates G-A, G-B of about 0.5 μm to 2 μm can be realized. Following fabrication, suitable bias voltages for the n+ regions, high and low magnitudes for G-A and G-B clock voltages, and bias gate potentials will be determined. Desired operating voltages may be determined by sweeping these potentials and comparing relative detector performance for all swept operating points, and maintaining the best bias regime configurations. It is preferred that a relatively thick oxide on the order of 50 Å be employed to protect gate oxides from damage due to high gate potentials, including potential magnitudes not likely to be encountered in normal substrate operation. While various embodiments of the present invention have been described with respect to a p substrate 110, it is understood that an n substrate could instead be used, or even an n well or a p well, providing doping levels are acceptable low for all modulation regimes.

CMOS detectors 140 operate with very fast modulation speed, typically on the order of nanoseconds, and thus have very short collection times. Incoming photon energy, e.g., $S_2$, releases photocharge (electrons) at various depths in the detector substrate. $S_2$ wavelength is perhaps 850 nm, a wavelength enabling deep penetration, e.g., 20 μm, into the detector substrate. Thus some of these charges generated deep within the substrate can take too long to arrive at collection regions of the CMOS detector to be promptly collected. One result is that the depth data represented by these late arriving charges is old relative to the data represented by the fast arriving charges, and the resultant acquired Z depth image includes erroneous ghost-like or echo-like data.

Thus there is a need to closely manage and categorize photocharge created within CMOS depth detectors based upon their time of arrival, and to assure substantial non-collection of late arriving charge. There is a need to maximize the number of photocharges whose creation time can be sufficiently accurately determined, and a need to minimize collection of photocharges whose creation time cannot be accurately determined, which charges would not contribute to a useful signal but instead increase shot noise. There is also a need in such CMOS detectors for a mechanism to shorten collection times for the non-late arriving charges, thereby enhancing system modulation contrast.

The present invention provides CMOS detectors (especially short collection time detectors) with a mechanism to manage and maximize collection of useful photocharge, while minimizing collection of not useful late arriving charge. The overall result is to enhance accuracy of depth data acquired by TOF systems.

SUMMARY OF THE INVENTION

The present invention recognizes that it can be counterproductive to simply maximize photocharge collection in a CMOS detector used in a three-dimensional TOF system. Simply stated, it is better to disregard late arriving photocharge, e.g., photocharge that arrives later for collection at the detector than faster arriving photocharge, than to allow such charge to contribute to the depth image produced by the TOF system. Thus, the present invention maximizes collection of substantially all photocharges whose creation time can be ascertained accurately, and minimizes collection of photocharges whose creation time cannot be ascertained accurately. Photocharges in the first category are charges that can be rapidly collected at the sensor collection region and will contribute meaningfully to the presently acquired depth image data. The creation time of such charges is reasonably known because the charges were created relatively near upper regions of the sensor semiconductor structure. However photocharges in the second category are charges that would arrive at the sensor collection region too late to meaningfully contribute to the presently acquired depth image data. These charges will have been created relatively deep within the sensor semiconductor structure, hence the longer time needed for them to reach a collection region, and uncertainty as to their time of creation. The rapidly collected charges represent accurate information as to the presently acquired depth image data, whereas the late arriving charges represent older depth image data that, if allowed to contribute to a depth image, would degrade the accuracy and quality of the presently acquired depth image data. Thus one aspect of the present invention enhances efficiency and accuracy of depth image data acquired by a TOF system by maximizing detection of useful (promptly arriving) charges, while minimizing detection of non-useful (late arriving) charges.

CMOS detectors in sophisticated TOF systems employ differential pixel detectors such that two collection regions (A and B) exist per pixel. Incoming optical energy, e.g., $S_2$, generates photocharge within the pixel sensor semiconductor structure, which charges are collected at the A or B regions according to phase of the $S_2$ signal. Photocharges whose arrival time can be ascertained accurately, e.g., promptly arriving charges, are quickly assigned to an arrival time interval. Preferably this is accomplished by applying voltages at the surface of the silicon substrate upon which the array of pixel photodetectors is fabricated. These voltages create a strong drift field that steers charge toward the correct A or B collection region. Doping gradients create additional drift fields to urge or move the charge into a substrate region within which the voltage created drift fields can take over. Preferably photocharges whose creation time cannot be ascertained accurately are minimized by exposing these charges to high doping levels, to shorten their lifetime. Consequently such shortened lifetime photocharges do not survive long enough to be exposed to drift fields and be moved towards collection areas. In embodiments, electric field barriers are created in the silicon substrate to impede movement of such photocharges towards the collection areas. Thus, there is a maximization of collected charges whose charge creation time is known with certainty, and a minimization of collection of other charges.

Embodiments of the present invention can be used with phase-based and non-phase-based TOF system detectors. In one aspect, embodiments of the present invention provide in the bottommost portion of the upper epitaxial collection region of interest a layer of epitaxy (epi) having a dopant concentration higher than the substrate. This highest dopant layer creates a barrier that prevents charge generated more deeply into the substrate from moving upward to be collected, such charge deemed late-arriving charge. In another aspect, embodiments of the present invention provide stratified regions of differently doped epitaxy within the upper epitaxial collection region of interest. Preferably each such layer is more lightly doped than the layer beneath it, and each of these layers is less heavily doped than the substrate. The electric field created by these strata of dopant gradient attract nearby charge (e.g., charge collected within the lower epitaxial collection region of interest) and urge the charge upward toward the next less heavily doped upper layer. CMOS detectors may employ one or more aspects of the present invention, to enhance quality of the acquired depth data, and to enhance AC modulation contrast. In another aspect of the present invention, the topmost layer of epitaxy is lightly doped to better enable the electric field resulting from overlying preferably elongated finger-like gates to further hasten charge collection.

Other features and advantages of the invention will appear from the following description in which the preferred embodiments have been set forth in detail, in conjunction with their accompanying drawings.

DETAILED DESCRIPTION OF THE INVENTION

Figure 1A:
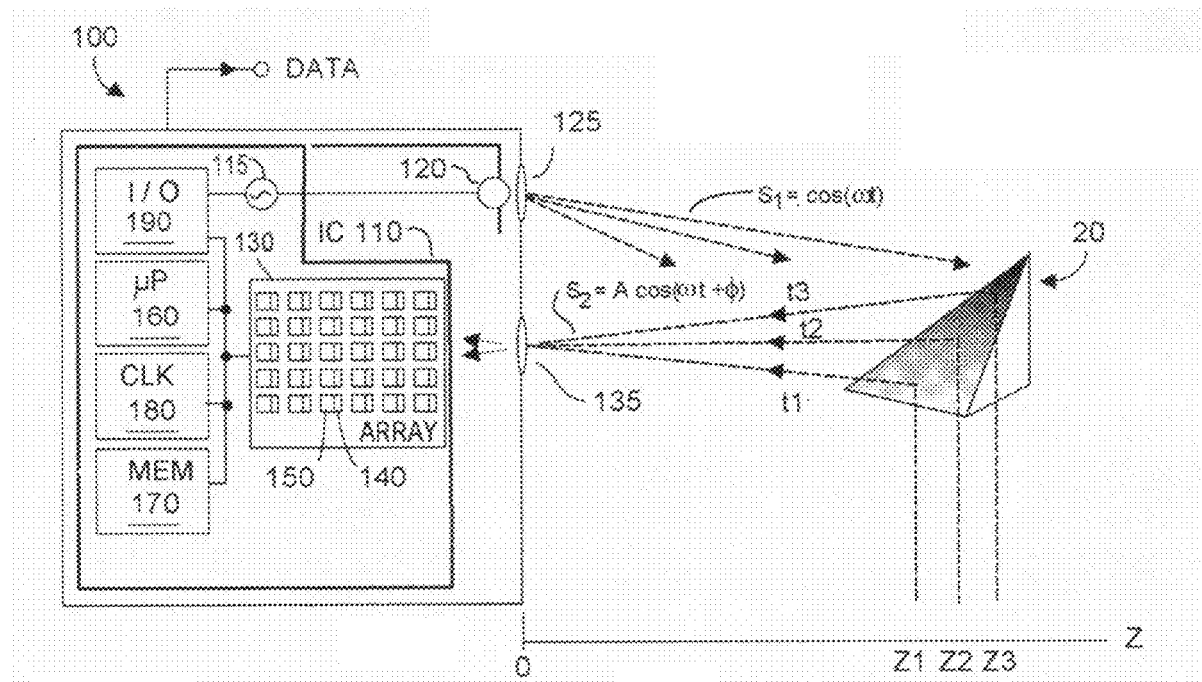
FIG. 1A depicts an exemplary phase-based TOF system according to the '454 patent, with which the present invention may be practiced.
Figure 1B:
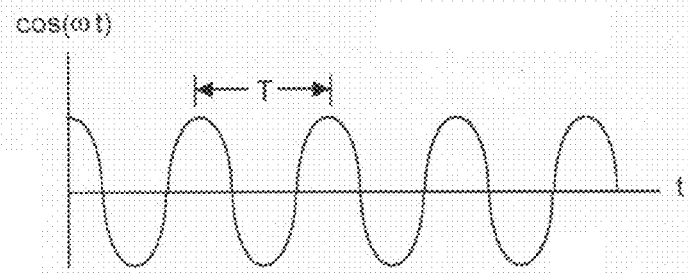
FIG. 1B depicts a transmitted periodic signal with high frequency components transmitted by the system of FIG. 1A, according to the '454 patent.
Figure 1C:
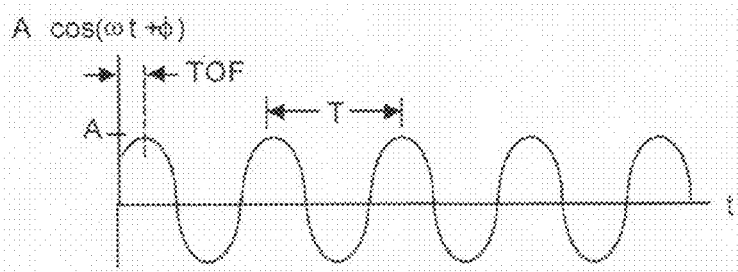
FIG. 1C depicts the return waveform with phase-delay for the transmitted signal of FIG. 1B, according to the '454 patent.

Embodiments of the present invention may be practiced with phase-based TOF systems such as depicted in FIG. 1A as exemplified by numerous U.S. patents to Canesta, Inc., including U.S. Pat. No. 7,352,454 (2008) or with non-phase based systems, e.g., as described in U.S. Pat. No. 6,323,942 (2001), assigned to Canesta, Inc. Embodiments of the present invention to improve collection of photocharge whose creation time is known, and to impede collection of photocharge whose creation time is not known (i.e., late arriving charge) can be implemented by modifying the structure of sensors 140 in FIG. 1A. Of course the present invention may be used with other sensors and may be used in non-TOF applications.

Sensors as described with respect to FIG. 1A, modeled on the '454 patent, thus are a good starting point. To recapitulate the description of the '454 sensors, the sensor structures included finger-shaped gate structures that extended along a y-axis, and were spaced-apart from each other a relatively short distance along the x-axis. Source collection regions were disposed adjacent distal ends of an associated elongated gate structure. Performance was determined more by the smaller x-dimensions than by the larger y-dimensions. Performance is characterized by high x-axis electric fields and rapid charge movement, as contrasted with lower y-axis electric fields and slower charge movement. Further performance enhancement resulted from implanting a potential barrier between adjacent gates and by forming a bias gate intermediate distal ends of the elongated gates and an associated source region. The resultant detector structures are operable at the more extreme gate voltages that are desirable for high performance and high contrast modulation.

Embodiments of the present invention will now be described, commencing with reference to FIG. 3A. According to the present invention, collection of photocharges released within a detector structure, for which charges creation time can be ascertained accurately is maximized, and such charges are quickly assigned to an arrival time interval. Further, according to the present invention collection of charges whose creation time cannot be accurately ascertained (so-called late arriving charge) is minimized, and in some embodiments is avoided. These aspects are realized by applying voltages to the upper surface of the detector structure, e.g., coupling bias voltages to polysilicon gates, to create strong drift fields near the upper surface, and by creating doping gradients to create drift fields and minimize diffusion paths between the fields. Late arriving charges are effectively minimized by exposing the charges to high doping levels. This exposure shortens the lifetime of the late arriving charges, and these charges thus are not subjected or exposed to drift fields in the direction of the charge collection regions. In some embodiments of the present invention, electric field barriers are provided to the detector structure to thwart movement of the late arriving charge towards the collection regions. "Collection" as used herein means collected charges reach within about 0.6 µm or less, from the silicon surface of the detector structure. Thus, without limitation, the term collection can encompass charges reaching surfaces of the silicon structure beneath polysilicon gates such as G-A, G-B as described in the '454 patent, or even reaching buried layers, for example layers such as may be found in CCD structures disposed within about 0.6 µm of the silicon surface.

Those skilled in the art will recognize that photon generated charge (here, electrons) can move relatively rapidly due to drift, and can move rapidly due to diffusion but the latter only over a few µm after which movement is very slow. Diffusion transit time is typically proportional to the square of the distance to be covered.

Figure 3A:
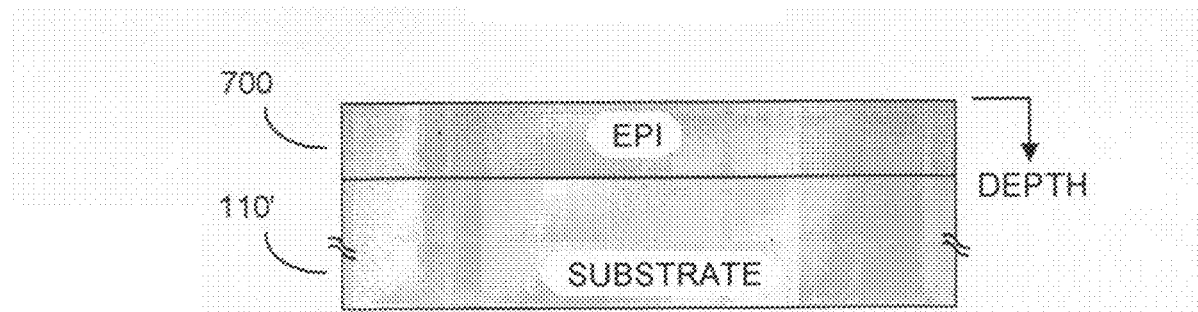
FIG. 3A is a cross-section of a silicon wafer having a lightly doped epitaxial layer atop a heavily doped substrate.
Figure 3B:
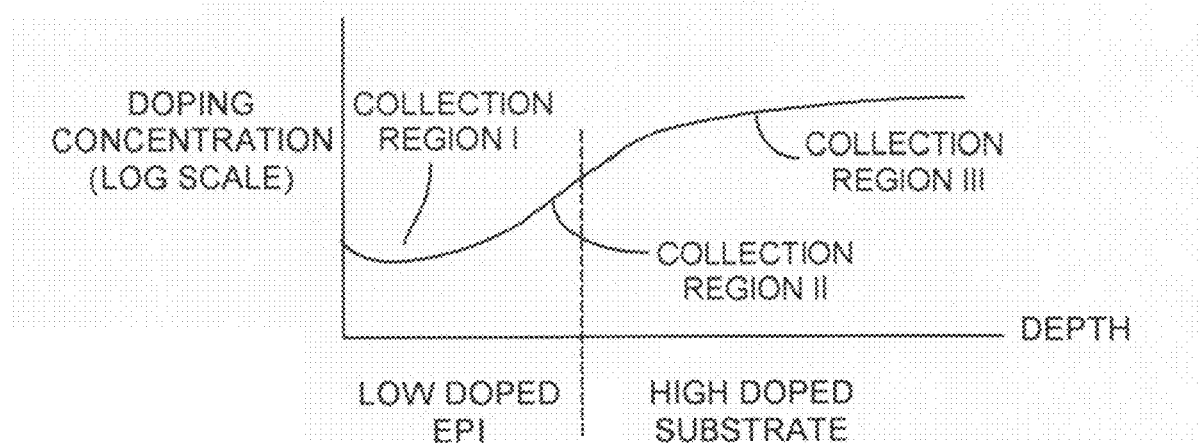
FIG. 3B depicts a doping profile for the structure of FIG. 3A, depicting concentration versus depth and depicting collection zones, according to embodiments of the present invention.

FIG. 3A depicts a silicon wafer comprising a heavily doped (e.g., $>10^{18}/cm^3$) substrate 110' with a thin layer of lightly doped (e.g., $<10^{16}/cm^3$) epitaxial (epi) material 700 grown on the upper surface. (Let all dopant types herein be p type.) FIG. 3B depicts doping levels within the epitaxial layer and the substrate, as function of depth into the substrate. The doping levels within the epitaxial layer have a gradient because the doping inside the substrate diffuses into the epi layer by thermal diffusion during fabrication of the wafer, and also during subsequent processing of the wafer during fabrication of an IC. All epi wafers have a gradient and the present invention advantageously engineers this gradient, e.g., by optimizing epi dopant concentration and/or epi thickness, to intelligently improve detection performance of TOF detectors. Note that as a result of processing steps after the top epi layer is fabricated, or as a result of the intentional addition of dopants during fabrication there may be a slight increase or decrease in dopant concentration at the surface of the epi (see FIG. 3B). The small electric fields created by such fluctuations (upward or downward) in dopant concentrations are readily overcome by the strong electric fields induced by the voltages on the poly gates at the surface of the silicon. These small electric fields will now be described further herein, and for ease of explanation, let it be assumed that doping concentration is substantially constant near the surface of the semiconductor structure.

Figure 3C:
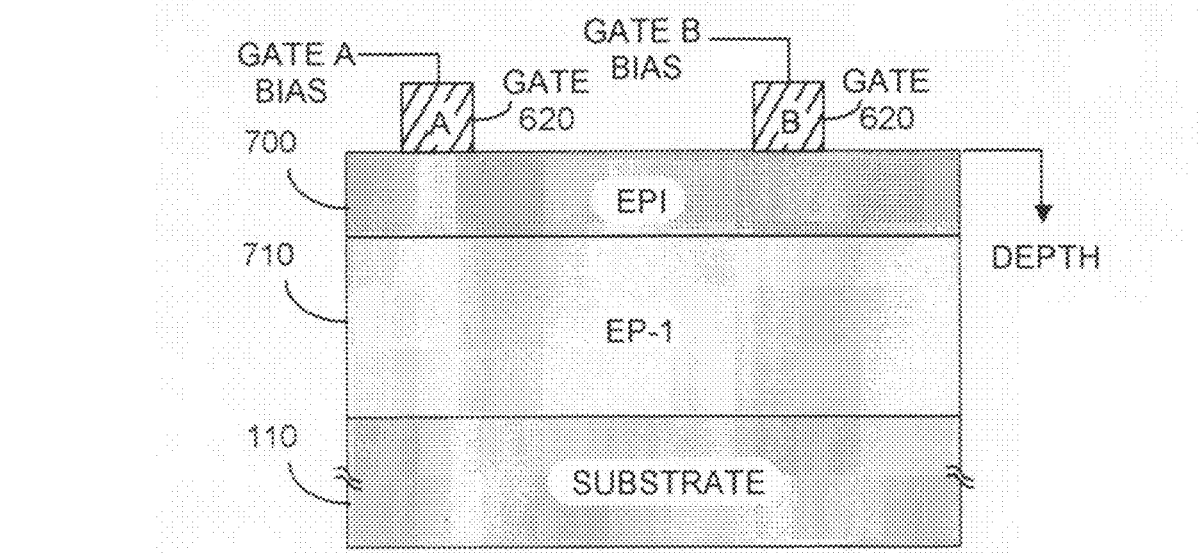
FIG. 3C is a cross-section of a multi-layered semiconductor structure that creates multiple zones of charge collection, according to embodiments of the present invention.
Figure 3D:
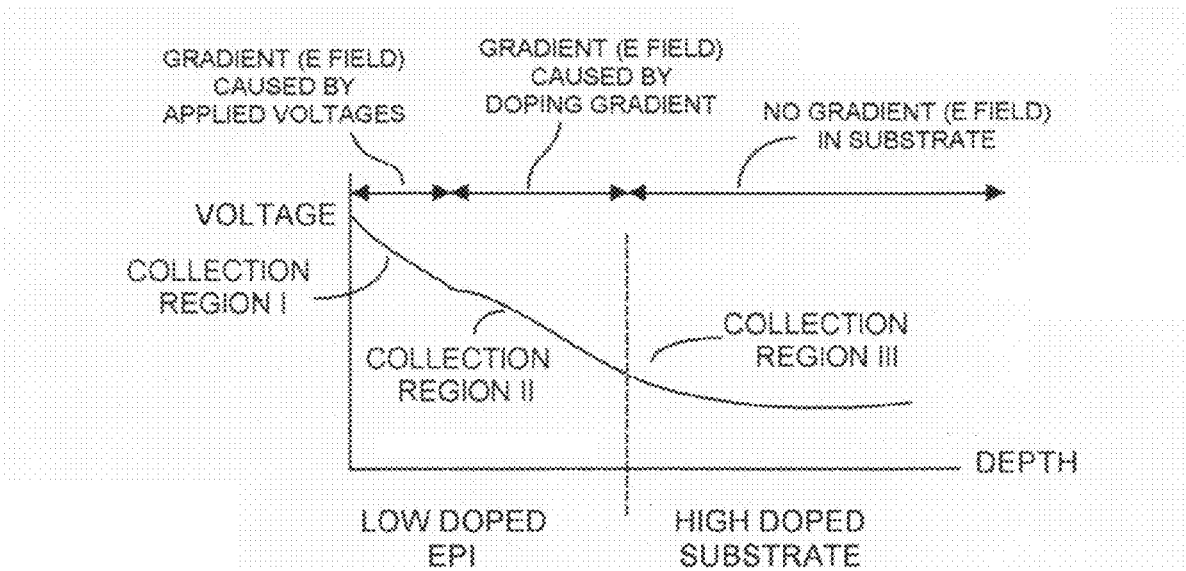
FIG. 3D is a voltage profile for the structure of FIG. 3C, depicting corresponding potential and indirectly E field as a function of depth, and depicting collection zones, according to embodiments of the present invention.

FIG. 3C is a cross-section of a semiconductor structure suitable for use in forming a detector 140, and FIG. 3D shows corresponding potential and (indirectly) E fields. These two figures show three possible charge collection zones. Although multiple zones and strata are shown in these (and subsequent figures), it is understood that a single epi deposition is grown, and the doping gradient forms during manufacture of the IC semiconductor structure. Thus the strata are layers per se, but rather regions of different charge collection properties.

Figure 2A:
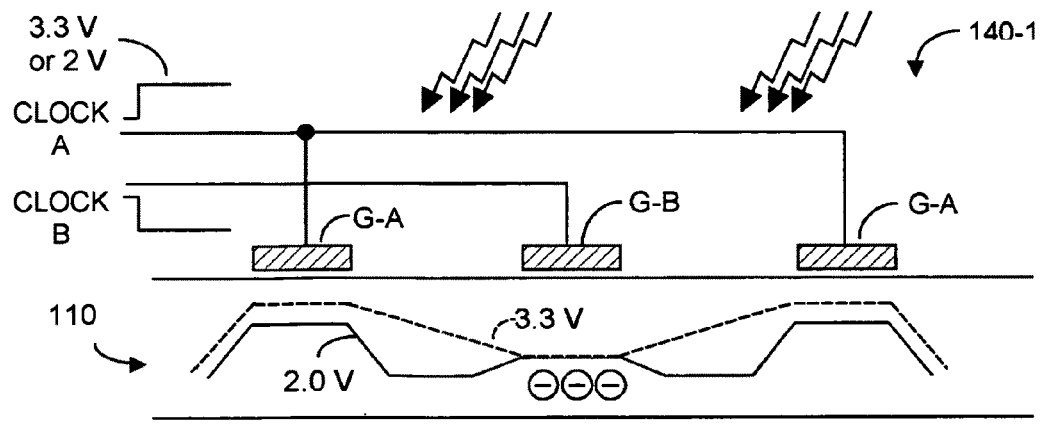
FIG. 2A is a cross-section of a sensor detector structure with a plot of surface potential at the silicon-gate oxide interface versus position along the X-direction, depicting undesired effects of high gate potential upon charge collection in an embodiment according to the '454 patent.
Figure 2B:
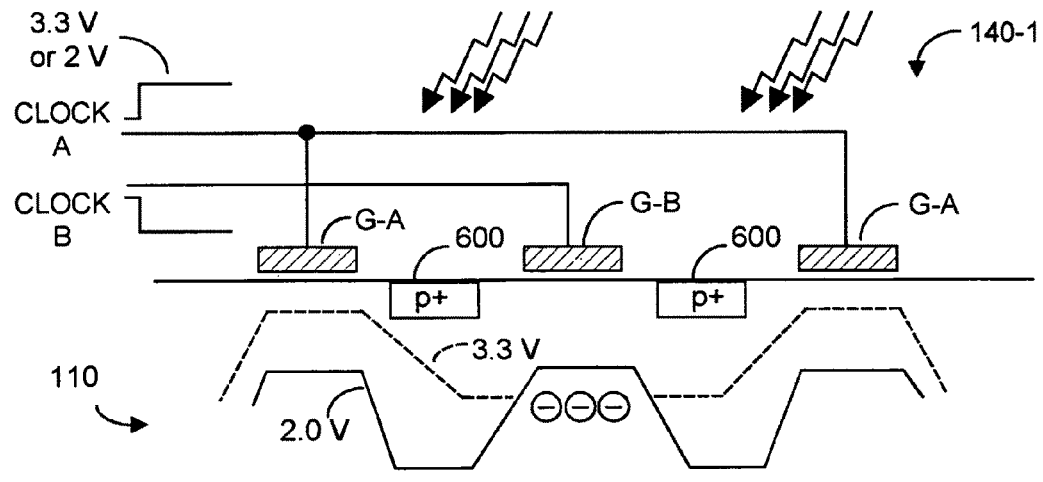
FIG. 2B is a cross-section of a sensor detector structure with a plot of surface potential at the silicon-gate oxide interface versus position along the X-direction, depicting enhanced high gate potential robustness of a detector structure provided with implanted barrier regions, according to embodiments of the '454 patent, and useable with embodiments of the present invention.
Figure 2C:
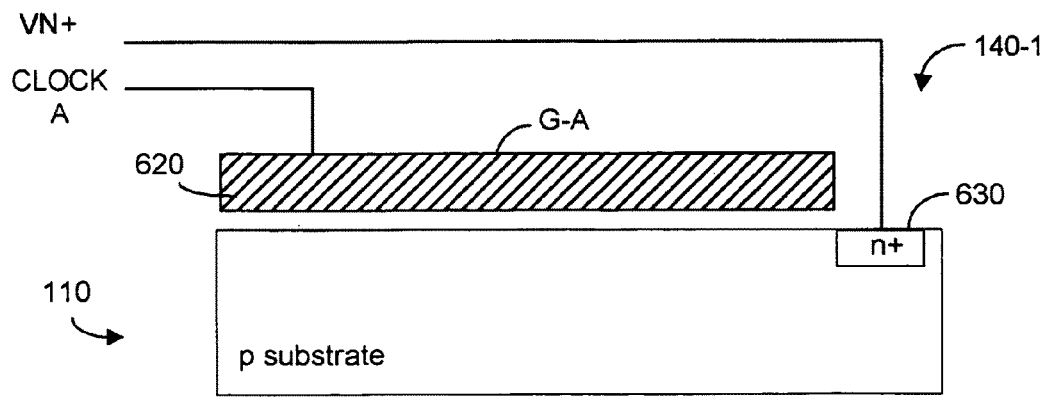
FIG. 2C is a cross-sectional view of a sensor detector structure along a finger-shaped collection G-A gate depicting loss of charge from the collector region to the G-A region if gate potential is too high absent structure modification according to an embodiment of the '454 patent.
Figure 2D:
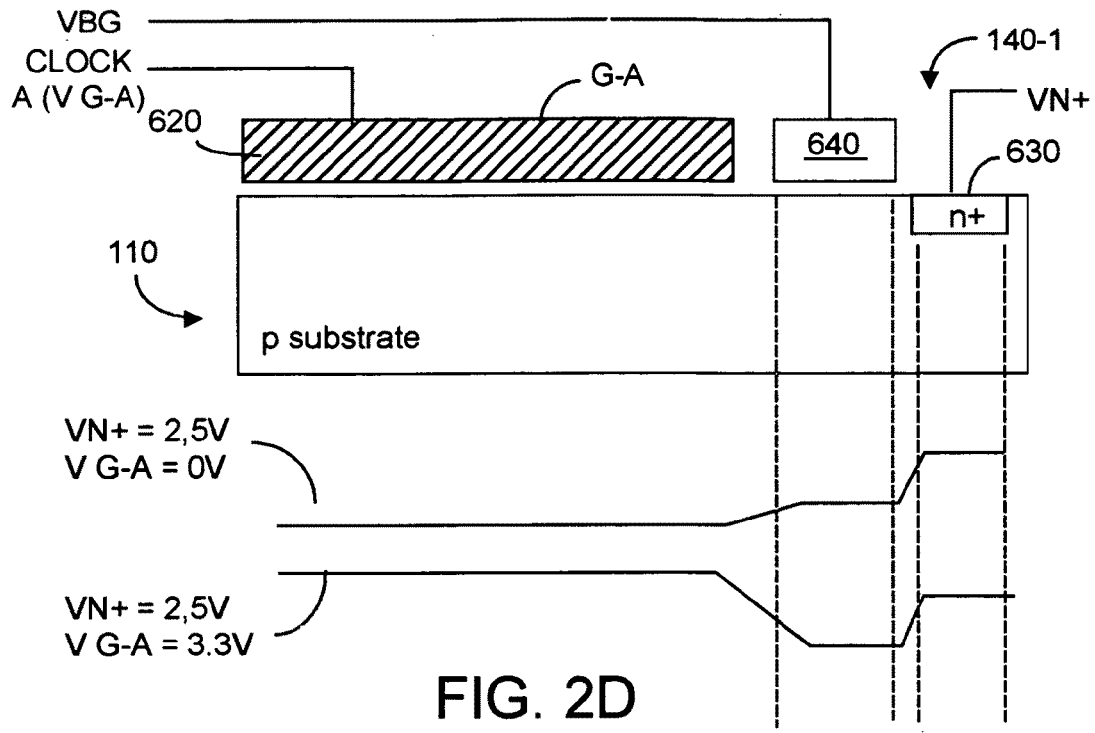
FIG. 2D is a cross-sectional view of the structure of FIG. 2C, modified to include a bias gate region to reduce loss of collected charge, and depicting surface potentials, according to embodiments of the '454 patent, and useable with embodiments of the present invention.
Figure 2E:
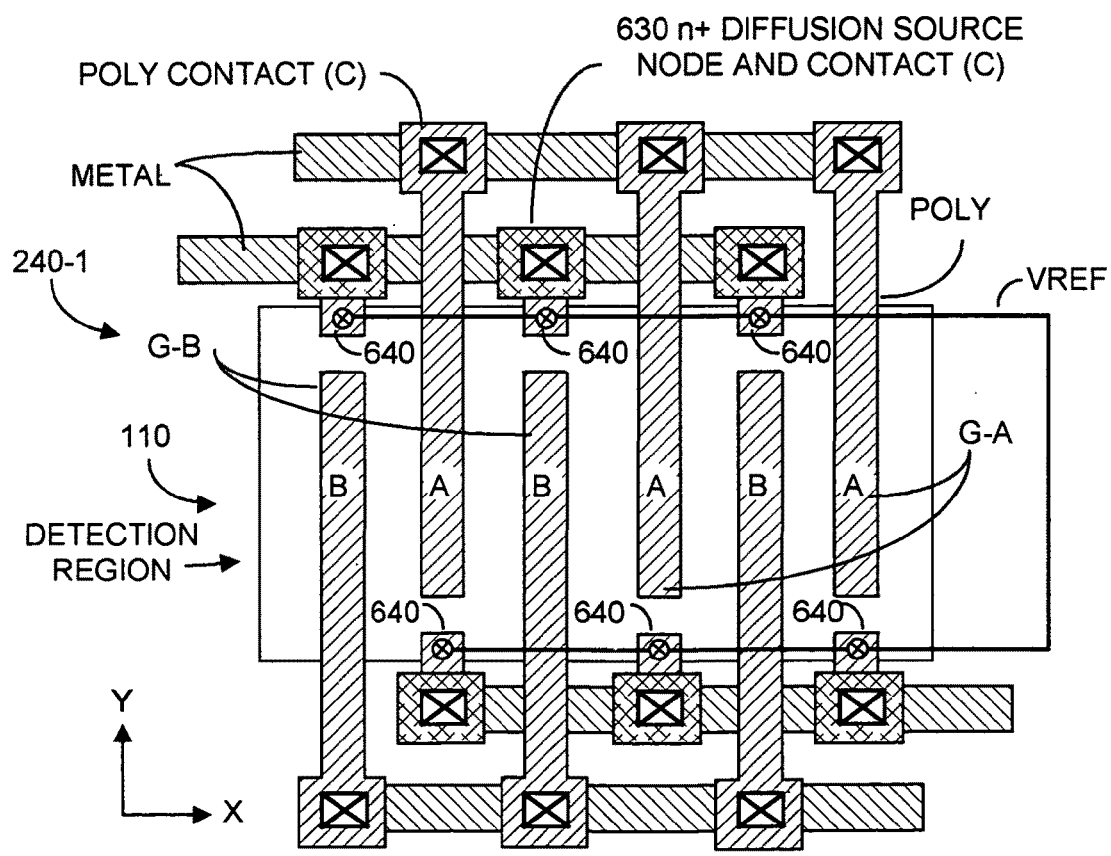
FIG. 2E is a plan view of a detector structure that includes bias gates, according to an embodiment of the '454 patent.

A first collection zone at the top of the structure, strata 700, is a very lightly doped region with no doping gradient. Electric fields in this region are governed by the voltages on the overlying poly gates 620, preferably elongated finger-like structures A or B, as shown in FIG. 2E. Because this region is lightly doped, the E field effect penetrates deeply perhaps about 2 μm. Overall, a positive voltage is coupled to these gates. As was shown in FIGS. 2D and 2E, some gates 620, e.g., G-A, will have a "low" voltage, 0 V, and alternating gates 620, e.g., G-B, will have a positive "high" voltage, or vice versa. Consequently negative photocharges will drift towards the finger-shaped gate at the surface of the silicon structure. The electric field in this region will be shaped by the finger-shaped poly gates. In a preferred embodiment, these electric fields are such that gates biased at 0 V will receive minimal charges whereas alternating gates biased at the high positive voltage receive most of the charge. A further description of this process may be found in the '454 patent.

Referring to FIG. 3C, note that a strong vertical drift field is created either by the epi dopant gradient and/or the bias voltages applied to the poly gates 620, gates-A or gates-B. It will be appreciated that the electric field induced by the poly gates need not penetrate until the second collection region II, i.e., there may be small zone in which there is little or no electric field because the effect from the poly gates is too remote. However, charges may still be collected efficient due to diffusion because the region is small, and consequently the additional delay due to diffusion is small. Diffusion time delay is proportional to the square of the distance, and hence for small distances, the diffusion time delay is small. This small distance or gap is typically <1 μm.

A second charge collection zone starts at a depth of about 2 μm from the silicon surface in strata 710, with epi doping steadily increasing in concentration from a low value at the surface to the very high levels near substrate 110. This steadily increasing doping concentration induces a gradient. This doping gradient gives rise to an electric potential as shown by FIG. 3D. This electric field creates a drift field that pushes negative photocharges to the top of the silicon into the very low doped region. Charge in this low doped region is then within a short time subjected to the electric field induced by potential coupled to the poly finger-shaped gates 620.

Consider now the third zone, which is a zone of preferably non-collection. Referring still to FIG. 3C, bottom region 110 contains heavily doped substrate, and no doping gradient will be present as dopant has reached its peak value, which is at the juncture the substrate dopant concentration, and is constant thereafter. Consequently no doping gradient induced electric field is present at the bottom region of the structure. Further, because there is a high doping concentration here, the substrate has high conductivity and thus has low resistance, which means no external electric field can penetrate into this region. Advantageously, photocharges generated in this deep substrate region are thus not subjected to any drift field. According to the present invention, drift fields in the epi, e.g., 710, resulting from doping gradients will result from about 0.1 V/20 μm, which is about 5 kV/m or greater. In practice, a field exceeding about 1 kV/m may suffice. Such charges (late arriving charges) wander aimlessly in the substrate and recombine (die) quickly due to the high doping levels in the substrate and their short carrier lifetime. These recombined unto death charges are the so-called late arriving charges. Had these charges been collected at the gates, they would detract from the more current information contained in more rapidly arriving collected charges. These late arriving charges would also contribute to undesired shot noise. As such, the arrival time for collection of these charges at the gates may be too long to contain useful timing information (e.g., especially if their expected arrival time is on the order of a cycle of the $S_1$ modulation frequency, a few ns).

Figure 3E:
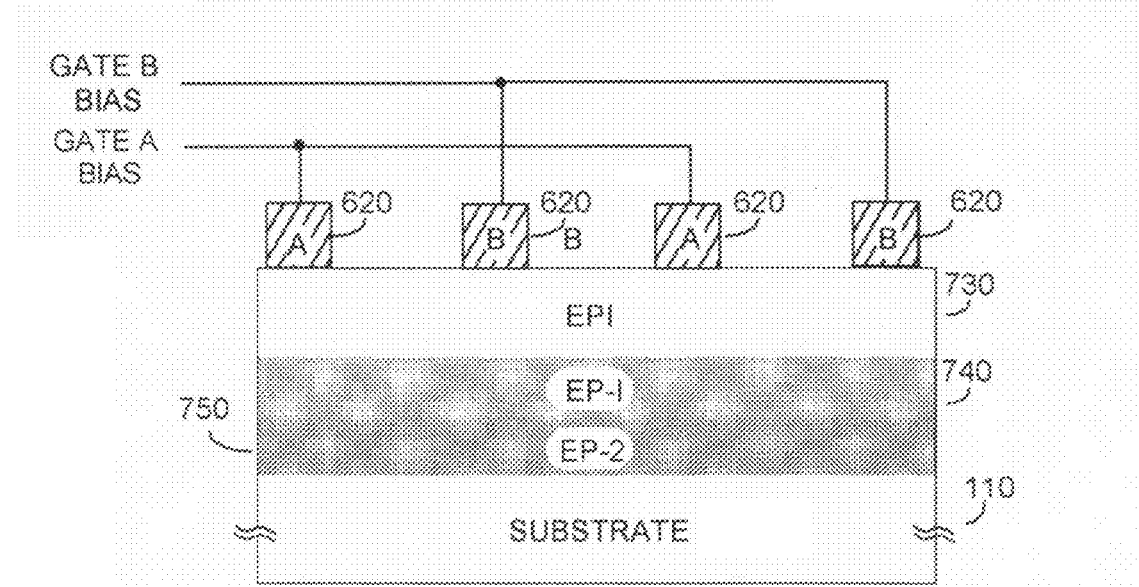
FIG. 3E is a cross-section of a semiconductor structure suitable for a detector, in which a more highly doped epi region is formed between the substrate and an upper lying low doped epi region, according to embodiments of the present invention.
Figure 3F:
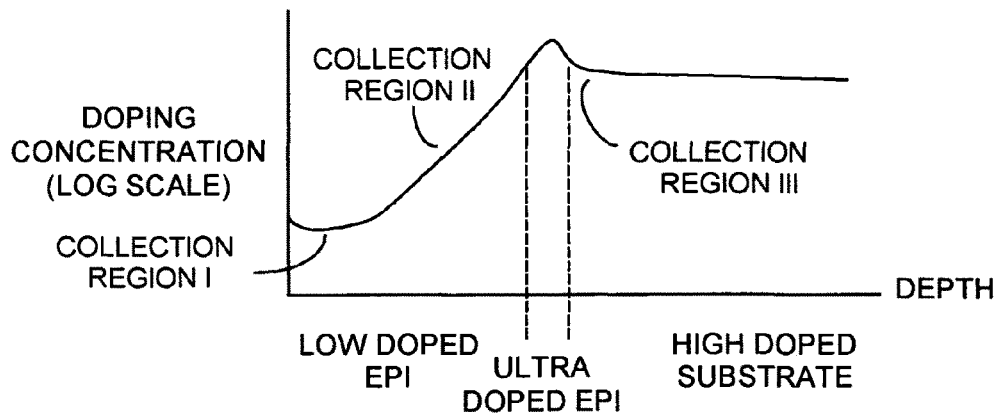
FIG. 3F is a doping profile for the structure shown in FIG. 3E, and depicting collection zones, according to embodiments of the present invention.
Figure 3G:
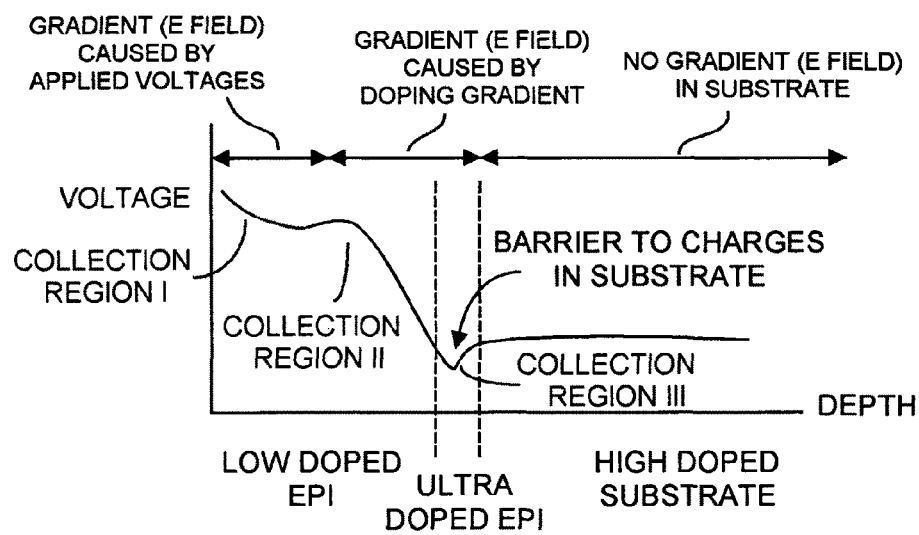
FIG. 3G depicts voltage profile and implicitly electric field for the structure shown in FIG. 3E, and depicting collection zones, according to embodiments of the present invention.

Consider now the exemplary detector structure shown in FIG. 3E, a structure with three collection zones that functions somewhat in the manner of a relay system. The structure of FIG. 3E is similar to that of FIG. 3C in that the function of strata 730, and 740 in FIG. 3E are similar to the functions of strata 700 and 710 in FIG. 3C. However the structure of FIG. 3E adds strata 750, a region whereat dopant concentrations decrease going toward the substrate. FIG. 3F depicts a peak in the doping concentration (in the ultra doped epi), at the interface of collection regions II and III. Consequently charges generated at or below strata 750 (see FIG. 3E) in the silicon structure will not migrate upward because of an electric field that points downward, thus creating a potential barrier. This downward pointing electric field is evidenced in FIG. 3G by the region associated with the ultra doped epi, in which the slope of the voltage changes direction. The resultant barrier ensures that late arriving charge, e.g., charge created deep within the structure, will not be captured and collected. Instead such potentially late arriving charge will simply die due to recombination. Note that the doping difference between the low doped region 730 and the higher magnitude of the doping at the bottom of region 740 may advantageously be increased. This flexibility in tailoring characteristics of detectors is but one advantage afforded by the present invention. This increased dopant differential advantageously creates an even stronger vertical drift field that can more rapidly urge charges released or created higher than the level of substrate 110 upward for quick collection in the gate regions.

Those skilled in the art will appreciate that too high an epi dopant concentration could create dislocations in the semiconductor crystalline structure at the interfaces of the doped epi region. Thus care must be taken in selecting doping concentrations to avoid exceeding the dislocation limit. Alternatively, substrate doping concentration could be slightly reduced to allow a corresponding reduction of dopant concentration in the highly doped epi region, to reduce stress in the crystalline structure.

In some applications, a single low doped epi region may suffice. However it will be appreciated that implementing a detector 140 with multiple epi layers can result in more tightly controlled doping gradients, and thus can yield more tightly controlled or tailored electric fields. It is noted, however, the creating structures with multiple epi layers will increase production cost and can require more sophisticated fab equipment than implementing structures with a single low doped epi region or strata.

Figure 3H:
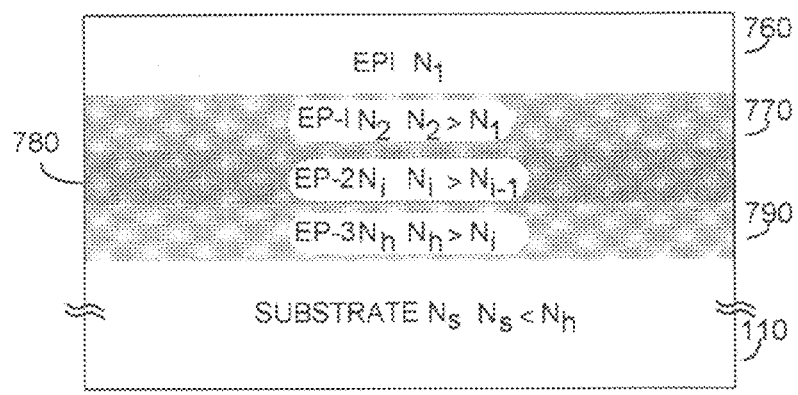
FIG. 3H depicts a multi-epi structure suitable for tightly tailoring doping gradients and resultant electric fields, according to embodiments of the present invention.

FIG. 3H depicts a detector structure showing multiple epi deposition layers 760, 770, 780, 790. An epi layer 760 at the top of the structure has doping concentration $N_1$. Beneath this layer is an epi layer 770 with doping concentration $N_2$, where $N_2 > N_1$. Beneath this is found epi layer 780 with doping concentration $N_i$, where $N_i > N_{i-1}$. Going deeper into the semiconductor structure is a super high doped epi substrate layer 790, with dopant concentration $N_h > N_i$. At the very bottom is substrate layer 110 with low dopant concentration $N_s$, where $N_s < N_h$. It will be appreciated that doping gradients will of course be generated at the interface of each epi deposition region. It will be appreciated that epi region 790 is higher doped than the substrate 110, thus creating the barrier described with respect to FIG. 3G. Consequently charge released in substrate 110 and lower regions of region 790 cannot readily move upward to be collected by the gates at the top of the structure. While the structure shown in FIG. 3H can afford the chip designer great flexibility in tailoring doping gradients and electric fields, the structure is complex and not inexpensive to fabricate.

Figure 3I:
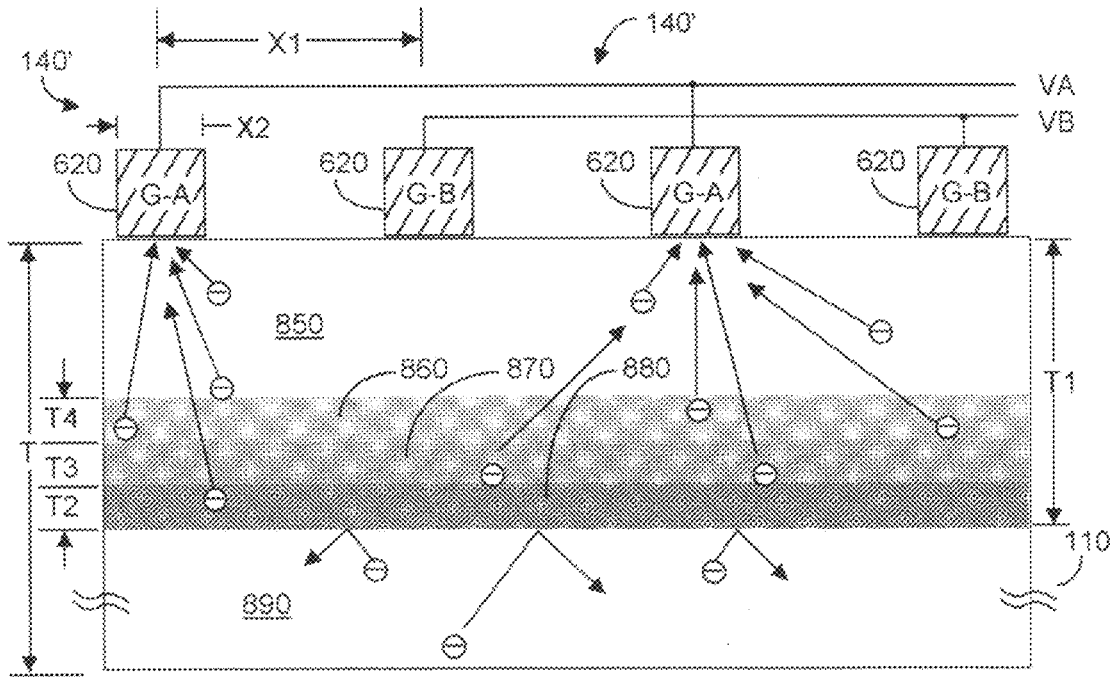
FIG. 3I depicts multiple epitaxial doping layers in a CMOS detector substrate, showing effect upon collection of charges created at different depths within the structure, according to embodiments of the present invention.

FIG. 3I depicts an exemplary pixel sensor 140', preferably part of a CMOS differential sensor, useable with a TOF system including TOF system 100 shown in FIG. 1A. The multi-layer epi structure depicted in FIG. 3I ensures non-capture of late-arriving charge while promoting rapid movement and collection of charge generated in the upper substrate region of interest, e.g., charge whose time of creation can be accurately determined. This structure further promotes good modulation contrast. FIG. 3I is a visual summary of what has been described herein, and shows exemplary paths taken by charge created at various depths in the structure depicted in FIG. 3H.

In FIG. 3I, the typically p type substrate 110 will of course be thick, perhaps 300 µm. However for a CMOS pixel detector 140' according to the present invention, the collection depth of interest T1 typically comprised perhaps the upper 6 µm or so, shown here as comprising several differently doped layers. FIG. 3I is simplified for ease of illustration and only depicts exemplary polysilicon gate structures 620, G-A and G-B on the silicon surface. In FIG. 3I, the spaced-apart distance X1 between adjacent gates is perhaps 1 µm, and each gate has a polysilicon width X2 of perhaps 0.2 µm, although other dimensions could of course be used.

Understandably, useful charge intended to be collected during one acquisition phase by gate G-A should be collected promptly by G-A, and not by gate G-B, and vice versa. In FIG. 3I, photocharges (shown as white encircled minus signs) generated within the substrate at depths greater than about T1, can take substantially longer to reach the substrate surface for collection than charges generated at depths shallower than T1 from the substrate surface. As a result, depth data represented by collection of such late arriving charge would be somewhat like a ghost or echo because slightly old data rather than current data is represented by these charges. Thus, detectors 140, 140' according to the present invention will impede collection of late arriving charge sufficiently long for such charge to die due to recombination before they can be collected by gates A 620 or gates B 620.

As noted earlier herein, charge can move relatively rapidly due to drift, and can move rapidly due to diffusion on the order of about one µm after which diffusion movement is very slow. Looking at FIG. 3I, it is apparent that charge generated more deeply than depth T1 will take a relatively long time to move up to the substrate surface to be collected by gates G-A or G-B 620.

As noted, embodiments of the present invention seek to implement two design goals. One goal is to not collect charges generated more deeply than depth T1 (these charges are deemed late-arriving charges). A second goal is to rapidly collect the other charges, e.g., charges generated within depth T1.

The first design goal may be realized by providing a bottommost layer of epitaxial beneath depth T1, whose epitaxial dopant concentration exceeds that of the substrate. The upward movement of substantially all charge generated lower than depth T1 is retarded by this layer of higher dopant concentration epitaxy. The second design goal may be realized by providing layers or strata of epitaxy within depth T1, where each layer has lower dopant concentration than the layer beneath it. Charges generated within depth T1 are rapidly urged upward by the electric fields at the interfaces between adjacent epitaxial layers, where dopant concentration levels decrease in the direction of the s surface. Preferably the uppermost epitaxy layer is lightly doped to better enable the electric fields resulting from biased overhead gate structures to hasten movement of charge. Although embodiments of the present invention generally employ p type substrate and use p dopants, it is understood that n type substrate and n dopants might be used instead by collecting the opposite kind of photocharges (holes).

More or fewer epitaxial layers could of course be used, preferably there is a bottommost layer more heavily doped than the substrate, with at least one less lightly doped epitaxial layer above this layer. Embodiments of the present invention may be implemented to substantially retard collection of late arriving charge, or to hasten collection of non late-arriving charge. Preferably, however, embodiments of the present invention will implement both aspects.

To recapitulate, embodiments of the present invention include stratified epitaxial layers as exemplified by FIG. 3H and FIG. 3I to retard collection of substantially all late arriving charge, and to promote fast collection of remaining change. This epitaxial layering may be used with the various detectors described in this application, and may be used with the described TOF systems. The quality of the acquired three dimensional data is enhanced, as is modulation contrast at high modulation frequencies.

While Canesta, Inc.'s various detectors have been described primarily for use with three-dimensional sensor systems, those skilled in the art will appreciate that detectors and indeed other devices can benefit from what has been described. Detectors with stratified epitaxial layer doping such as shown in FIG. 3I may be included in the various TOF systems described herein, as well as in two-dimensional cameras. Battery operated detection systems can be fabricated using peak and average optical emitter power in the tens or hundreds of mW range, while still maintaining cm range distance resolution, improved modulation contrast, and good signal/noise ratios.

Modifications and variations may be made to the disclosed embodiments without departing from the subject and spirit of the invention as defined by the following claims.

What is claimed is:

1. A method ensuring rapid collection of photonically generated charges created in an upper region of a CMOS sensor, while impeding collection of photonically generated charges created in a lower region of said CMOS sensor, the method comprising the following steps:
    (a) from time of generation of said photonically generated charges to time of collection of said photonically generated charges, moving said photonically generated charges created in said upper region upward toward a collection region of said sensor, said moving resulting from at least one of (i) drift field resulting from an electric field of at least 1 kV/m to urge said photonically generated charges upward toward a collection region of said CMOS sensor, and (ii) diffusion over a diffusion length of less than about 1 µm; and
    (b) from time of generation of said photonically generated charges, delaying upward movement of substantially all said photonically generated charges created in said lower region for a time period exceeding recombination lifetime of said photonically generated charges.

2. The method of claim 1, wherein at step (a)(i), said drift field results from at least one of (1) coupling voltage to a surface region of said CMOS sensor, and (2) creating a doping gradient in said upper region.

3. The method of claim 1, wherein at step (a)(ii) said diffusion results from at least one of (1) thermal energy, and (2) mutual repulsion among said charges.

4. The method of claim 1, wherein step (b) includes subjecting said photonically generated charges created in said lower region to at least one of (i) a high doping region formed within said CMOS sensor, said high doping region having dopant concentration sufficiently high to shorten charge carrier lifetime to a value less than time required for said photonically generated charges to reach said upper surface, and (ii) a voltage barrier created to inhibit upward movement of said photonically generated charges toward said upper surface.

5. The method of claim 4, wherein at step (b)(ii) said CMOS sensor includes a substrate and an epitaxial layer, and said voltage barrier results from forming said epitaxial layer with a higher dopant concentration than a dopant concentration of said substrate.

6. The method of claim 2, wherein said CMOS sensor includes at least one layer of epitaxial material, and said doping gradient results at least in part from difference in doping concentration between said epitaxial material and a layer in said sensor underlying said epitaxial material.

7. The method of claim 2, wherein said CMOS sensor includes at least a first layer of epitaxial material and a second layer of epitaxial material, and said doping gradient results at least in part from different in doping concentration between said first epitaxial material and said second epitaxial material.

8. The method of claim 1, wherein said CMOS sensor is a time-of-flight (TOF) sensor.

9. The method of claim 8, wherein at step (a)(i), said drift field results from at least one of (1) coupling voltage to a surface region of said CMOS sensor, and (2) creating a doping gradient in said upper region.

10. The method of claim 8, wherein at step (a)(ii) said diffusion results from at least one of (1) thermal energy, and (2) mutual repulsion among said photonically generated charges.

11. The method of claim 8, wherein step (b) includes subjecting said photonically generated charges created in said lower region to at least one of (i) a high doping region formed within said CMOS sensor, said high doping region having dopant concentration sufficiently high to shorten charge carrier lifetime to a value less than time required for said photonically generated charges to reach said upper surface, and (ii) a voltage barrier created to inhibit upward movement of said photonically generated charges toward said upper surface.

12. The method of claim 11, wherein at step (b)(ii) said CMOS sensor includes a substrate and an epitaxial layer, and said voltage barrier results from forming said epitaxial layer with a higher dopant concentration than a dopant concentration of said substrate.

13. The method of claim 9, wherein said CMOS sensor includes at least one layer of epitaxial material, and said doping gradient results at least in part from difference in doping concentration between said epitaxial material and a layer of said CMOS sensor underlying said epitaxial material.

14. The method of claim 9, wherein said CMOS sensor includes at least a first layer of epitaxial material and a second layer of epitaxial material, and said doping gradient results at least in part from difference in doping concentration between said first epitaxial material and said second epitaxial material.

15. A CMOS detector that generates photocharge in response to detection of incoming photonic energy, the detector including:
    a substrate having a substrate dopant concentration $N_S$ and including an upper substrate surface, and a substrate thickness that includes at least an upper substrate region and a lower substrate region,
    a layer of epitaxial material overlying at least a region of said upper substrate surface, and having a epitaxial dopant concentration $N_E$; and
    at least one gate structure fabricated on said upper substrate surface, coupleable to a source of bias voltage, and disposed so as to create a first electric field in at least a portion of said upper substrate region;
    wherein magnitude of said $N_S$ and magnitude of said $N_E$ are selected to create a second electric field within said substrate that in combination with said first electric field rapidly conveys photocharges created within said upper substrate region to said upper substrate surface for collection, while substantial numbers of photocharges generated at a depth lower than said upper substrate region recombine without being collected; and
    wherein photocharges generated at a depth not exceeding depth of said upper substrate region are photocharges created more recently than photocharges generated within said lower substrate region.

16. The sensor of claim 15, wherein $N_E > N_S$.

17. The sensor of claim 15, wherein said first electric field extends downward into at least a portion of said upper substrate region to further hasten collection of more recently generated said photocharge.

18. The sensor of claim 17, wherein photocharges generated in said upper substrate region move upward within said sensor to be collected as a result of at least one characteristic of said sensor selected from (i) coupling a bias voltage to said gate structure creates an electric field exceeding about 1 kV/m, which field creates a drift field that moves photocharges created in said upper substrate region upward for collection, and (ii) presence of diffusion over a diffusion length less than about 1 µm.

19. The sensor of claim 15, further including at least one additional layer of semiconductor material having a layer thickness and having a layer dopant concentration $N_L$, where $N_E > N_L > N_S$;
    wherein magnitude of $N_L$ relative to magnitude of $N_S$ results in a low drift field within said layer thickness such that charges generated within said lower substrate region that reach said additional layer recombine and perish and will not be collected.

20. The sensor of claim 15, wherein said sensor is a sensor in a time-of-flight (TOF) system, and sensed said photocharges provide a measure of depth distance to a target object imaged by said system.

* * * * *